(12) United States Patent
Xu et al.

(10) Patent No.: US 9,413,345 B2
(45) Date of Patent: Aug. 9, 2016

(54) METHOD OF CONTROLLING ELECTRONIC DEVICE AND ELECTRONIC DEVICE

(71) Applicants: Beijing Lenovo Software Ltd., Haidian District, Beijing (CN); Lenovo (Beijing) Co., Ltd., Beijing (CN)

(72) Inventors: Lingjun Xu, Beijing (CN); Fanzhi Li, Beijing (CN)

(73) Assignees: BEIJING LENOVO SOFTWARE LTD., Haidian District, Beijing (CN); LENOVO (BEIJING) CO., LTD., Haidian District, Beijing (CN)

( * ) Notice: Subject to any disclaimer, the term of this patent is extended or adjusted under 35 U.S.C. 154(b) by 488 days.

(21) Appl. No.: 13/923,549

(22) Filed: Jun. 21, 2013

(65) Prior Publication Data
US 2013/0342031 A1    Dec. 26, 2013

(30) Foreign Application Priority Data
Jun. 21, 2012    (CN) .......................... 2012 1 0212346

(51) Int. Cl.
*H03K 5/153*    (2006.01)
(52) U.S. Cl.
CPC ..................... *H03K 5/153* (2013.01)
(58) Field of Classification Search
CPC ....................................................... H03K 5/153
USPC ...................................................... 340/12.27
See application file for complete search history.

(56) References Cited

U.S. PATENT DOCUMENTS

| 6,243,258 B1 * | 6/2001 | Paratore ................ G06F 1/1618 345/168 |
| 2005/0057489 A1 | 3/2005 | Kung et al. |
| 2009/0143106 A1 * | 6/2009 | Meitzler ........... H04M 1/72527 455/566 |

FOREIGN PATENT DOCUMENTS

| CN | 101493745 A | 7/2009 |
| CN | 201654625 U | 11/2010 |

OTHER PUBLICATIONS

CN201210212346.9 Second Office Action dated Apr. 15, 2015 (14 pages including English translation).
Chinese First Office Action with English Translation for related Application No. 201210212346.9 dated Sep. 15, 2014, 15 pages.

* cited by examiner

*Primary Examiner* — Jennifer Mehmood
*Assistant Examiner* — Yong Hang Jiang
(74) *Attorney, Agent, or Firm* — Brinks Gilson & Lione; G. Peter Nichols

(57) ABSTRACT

A control method and an electronic device are described. The method is applied in an electronic device which includes a first body, a second body and a rotary apparatus. On at least one body of the first body and the second body, there are provided M number of input apparatuses; the first body and the second body are rotatably connected together, where M is an integer greater than or equal to 1. The state-information of the first body and/or the second body is detected, to obtain a detection result; when the detection result indicates that the first body and/or the second body are/is in a motion state, a disable command is generated; the disable command is executed, so that N number of input apparatuses from the M number of input apparatuses are in a disabled state, where N is an integer less than or equal to M.

8 Claims, 3 Drawing Sheets

METHOD OF CONTROLLING ELECTRONIC DEVICE AND ELECTRONIC DEVICE

This application claims priority to Chinese patent application No. CN CN201210212346.9 filed on Jun. 21, 2012, the entire contents of incorporated herein by reference.

The present invention relates to the field of computer technology, particularly to a method of controlling an electronic device, and an electronic device.

BACKGROUND

With popularity of electronic devices, various forms of electronic devices have been proposed, for instance, computers, which are started with desktop computers, and next developed to notebook computers, and then developed to 360-degree-openable-and-closable laptop computers, all of these various forms of computers have brought great convenience to people's lives, works and studies.

However, the inventors have found in the process of implementing the present invention that, although the notebook computers or the 360-degree-openable-and-closable laptop computers bring great convenience to people's lives, in the case that a user opens/closes a laptop computer, it is very likely that the user grips both the display unit and the main body of the notebook computer to turn and rotate, and at this point, the user's intention is not to operate the notebook computer, but due to the grip an input device of the computer, such as a touch screen, touch panels, etc., it is prone to producing an inadvertent touch operation.

SUMMARY

The present invention provides a method of controlling an electronic device, and an electronic device, for solving a technical problem existing in the prior art that it is prone to producing an inadvertent touch operation while opening and closing an electronic device.

One aspect of the present invention provides a method of controlling an electronic device; the method is applied in an electronic devi ce, and the electronic device comprises a first body, a second body and a rotary apparatus; on at least one body of the first body and the second body, there are provided M number of input apparatuses; the first body and the second body are rotatably connected together through the rotary apparatus, where M is an integer greater than or equal to 1; the method is characterized in that, it comprises: the state-information of the first body and/or the second body is detected, to obtain a detection result; when the detection result indicates that the first body and/or the second body are/is in a motion state, a disable command is generated; the disable command is executed, so that N number of input apparatuses from the M number of input apparatuses are in a disabled state, where N is an integer less than or equal to M.

Preferably, said step of detecting the state-information of the first body and/or the second body, specifically is:
a first absolute included-angle between the first body and a first reference plane is detected, and/or, a second absolute included-angle between the second body and a second reference plane is detected, wherein, the first reference plane and the second reference plane are the same or different reference planes; or
a first acceleration of the first body is detected, and/or, a second acceleration of the second body is detected; or
an included-angle between the first body and the second body is detected; or it is detected whether or not a gripping body grips the first body and/or the second body.

Preferably, the second included-angle is smaller than the first included-angle.

Preferably, said step that a disable command is generated when the detection result indicates that the first body and/or the second body are/is in a motion state, specifically is:
when the first absolute included-angle and/or the second absolute included-angle have/has a change, the disable command is generated; or
when the first acceleration and/or the second acceleration are/is not zero, the disable command is generated; or
when the included-angle has a change, the disable command is generated; or
when a gripping body grips the first body and/or the second body, the disable command is generated.

Preferably, said step of generating a disable command, specifically is: a disable command is generated, for disabling the N number of input apparatuses; or, N number of disable sub-commands are generated, for disabling the N number of input apparatuses respectively.

Preferably, when the detection result indicates that the first body and/or the second body are/is in a motion state, before the disable command is generated, the method further comprises: the grip-position-information of the gripping body on the first body and/or the second body is detected and obtained; based on the grip-position-information, it is judged whether or not the distance between the gripping body and the respective M number of input apparatuses meets a predefined condition, to obtain M number of judgement results; based on the M number of judgement results, the N number of input apparatuses from the M number of input apparatuses are determined, wherein, the distance between each input apparatus of the N number of input apparatuses and the gripping body meets the predefined condition.

Preferably, after the disable command is executed, the method further comprises: the state-information of the first body and/or the second body is detected, to obtain a second detection result; when the second detection result indicates that the first body and the second body both are not in the motion state, an enable command is generated; the enable command is executed, so that the N number of input apparatuses are in an enabled state.

Preferably, after the second detection result is obtained, the method further comprises: when the second detection result indicates that the first body and/or the second body are/is in a motion state, the N number of input apparatuses are remained in the disabled state.

Another aspect of the present invention provides an electronic device, comprising: a first body; a second body; a rotary apparatus, through which the first body and the second body are rotatably connected together; M number of input apparatuses, provided on at least one body of the first body and the second body, where M is an integer greater than or equal to 1; a detection unit, which is used to detect the state-information of the first body and/or the second body, so as to obtain a detection result; a processing unit, which is used: to generate a disable command, when the detection result indicates that the first body and/or the second body are/is in a motion state; to execute the disable command, so that N number of input apparatuses of the M number of input apparatuses are in a disabled state, where N is an integer less than or equal to M.

Preferably, the processing unit specifically is used: when the detection result indicates that the first body and/or the second body are/is in a motion state and before the disable command is generated, to detect and obtain grip-positioninformation of a gripping body on the first body and/or the second body; based on the grip-position-information, to judge whether or not the distance between the gripping body and the respective M number of input apparatuses meets a predefined condition, so as to obtain M number of judgement results; based on the M number of judgement results, to determine N number of input apparatuses from the M number of input apparatuses, wherein, the distance between each input apparatus of the N number of input apparatuses and the gripping body meets the predefined condition.

Preferably, the detection unit specifically is a pressure sensor, which is provided on the first body and/or the second body, and which is used: to detect whether or not a gripping body grips the first body and/or the second body; and when a gripping body grips the first body and/or the second body, to obtain the detection result.

One or more technical solutions provided in the embodiments of the present invention, has/have at least the following technical effects or advantages:

In an embodiment of the present invention, by detecting state-information of two bodies of an electronic device, it is judged whether or not the two bodies of the electronic device are in a motion state, i.e., whether or not there is an opening/closing action; when the judgement result is that at least one of the two bodies is in a motion state, a disable command is generated; then the disable command is executed, so that N number of input apparatuses from M number of input apparatuses are in a disabled state; thus, even if an input apparatus is inadvertently touched by a user in the process of opening/closing the electronic device, it will not cause a misoperation.

Furthermore, in an embodiment of the present invention, when it is detected that the electronic device is in an opening/closing state, it further detects whether there is a gripping body, such as grip-position-information of a user's hand on the two bodies; next, based on the grip-position-information, it judges whether or not the distance between the gripping body and the respective M number of input apparatuses meets a predefined condition; then, N number of input apparatuses from the M number of input apparatuses are determined, i.e., it is sufficient to disable only the input apparatuses close to the user's hand, and unnecessary to disable all the input apparatuses; thus, time and resources can be saved.

DETAILED DESCRIPTION

The present invention provides a method of controlling an electronic device, and an electronic device, for solving a technical problem existing in the prior art that it is prone to producing an inadvertent touch operation while opening and closing an electronic device.

In order to solve the above-described technical problem, the technical solutions in the embodiments of the present invention, have an overall conception as follows:

By detecting state-information of two bodies of an electronic device, it is judged whether or not the two bodies of the electronic device are in a motion state, i.e., whether or not there is an opening/closing action; when the judgement result is that at least one of the two bodies is in a motion state, a disable command is generated; then the disable command is executed, so that N number of input apparatuses from M number of input apparatuses are in a disabled state; thus, even if an input apparatus is inadvertently touched by a user in the process of opening/closing the electronic device, it will not cause a misoperation.

To provide better understand of the above-mentioned technical solutions, below, in connection with the accompanying drawings and specific embodiments, the above-mentioned technical solutions will be explained in detail.

Figure 1:
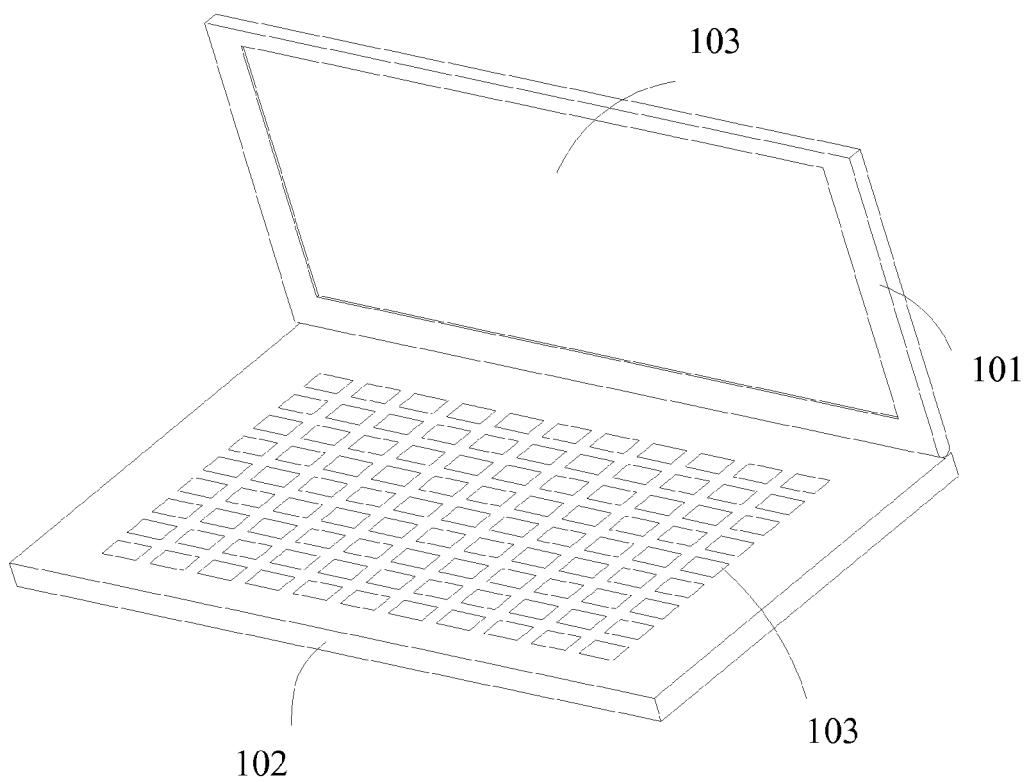
FIG. 1 is a structural diagram of an electronic device, provided in an embodiment of the present invention.

An embodiment of the present invention provides a method of controlling an electronic device, applied in an electronic device; with reference to FIG. 1, FIG. 1 is a structural diagram of an electronic device, provided in this embodiment.

As shown in FIG. 1, the electronic device comprises: a first body 101, a second body 102 and a rotary apparatus (not shown); the first body 101 and the second body 102 are rotatably connected together through the rotary apparatus; on at least one body of the first body 101 and the second body 102, there are provided M number of input apparatuses 103, where M is an integer greater than or equal to 1; in this embodiment, there is one input apparatus 103 on the first body 101, for example a touch screen, and there is one input apparatus 103 on the second body 102, for example a keyboard or a touch-control panel. The electronic device is, for example, a notebook computer or an mode-switchable electronic device, such as being switchable from a notebook computer to a tablet computer; of course, in other embodiments, the electronic device may also be other openable-and-closable electronic devices that has an input apparatus.

Figure 2:
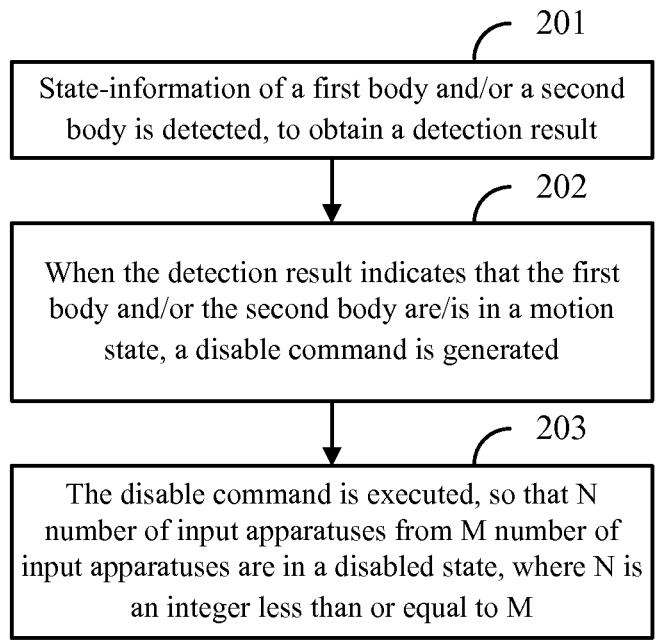
FIG. 2 is a flowchart showing a method of controlling an electronic device, provided in an embodiment of the present invention.

Further, with reference to FIG. 2, FIG. 2 is a flowchart showing a method of controlling an electronic device, provided in this embodiment. The method comprises:

Step 201: the state-information of the first body 101 and/or the second body 102 is detected, to obtain a detection result;

Step 202: when the detection result indicates that the first body 101 and/or the second body 102 are/is in a motion state, a disable command is generated;

Step 203: the disable command is executed, so that N number of input apparatuses from the M number of input apparatuses 103 are in a disabled state, where N is an integer less than or equal to M.

In step 201, the state-information of the first body 101 and/or the second body 102 is detected to obtain a detection result, and the detection can be performed by a detection unit provided on the electronic device; this step can have various implementing forms in specific embodiments, which will be explained below by way of example, instead of limitative to the present invention.

For example, in the first embodiment, the detection unit specifically is a gravity sensor; a gravity sensor may be provided on the first body 101, so that it can detect a first absolute included-angle between the first body 101 and a first reference plane, and the first reference plane is for example the ground; when it is detected that the first absolute included-angle is different from the value of the previously-stored first absolute included-angle, it indicates that the spatial position of the first body has changed; thus, it can be judged that the electronic device is undergoing an opening/closing action, or it is moving along with gripping by a user; therefore, at this point, step 202 can be executed, so that a disable command is generated; further, step 203 is executed, so that the disable command is executed, thus the input apparatuses 103 are in a disabled state. Thus, even if the input apparatus 103 is inadvertently touched by a user in the process of opening/closing the electronic device, it will not cause a misoperation.

Of course, the gravity sensor also may be only provided on the second body 102, and used to detect a second absolute included-angle between the second body 102 and a second reference plane, and the second reference plane for example also may be the ground, and of course also may be any other reference plane different from the first reference plane; further, it is possible that, a gravity sensor is provided on the first body 101, and at the same time, a gravity sensor is also provided on the second body 102; in step 102, it is possible that, when either the gravity sensor provided on the first body 101 or the gravity sensor provided on the second body 102 detects a change in angle, a disable command can be generated; in order to more precisely determine whether or not the electronic device is in a motion state, it is also possible that, when the two gravity sensors on the two bodies both detect a change in angle, a disable command can be generated; in this regard, the skilled in the art can make setting according to actual needs.

In the second embodiment, the detection unit specifically may be a gyroscope, and may be provided on the first body 101 and used to detect an acceleration of the first body 101, and also may be provide on the second body 102 and used to detect an acceleration of the second body 102; of course, it is possible that a gyroscope may be simultaneously provided on the first body 101 and on the second body 102; in step 102, it is possible that, when either the gyroscope provided on the first body 101 or the gyroscope provided on the second body 102 detects a change in acceleration, a disable command can be generated; in order to more precisely determine whether or not the electronic device is in a motion state, it is also possible that, when the two gyroscopes on the two bodies both detect a change in acceleration, a disable command can be generated; in this regard, the skilled in the art can make setting according to actual needs.

In the third embodiment, the detection unit specifically may be an angular displacement sensor, and provided between the first body 101 and the second body 102, or provided directly on the rotary apparatus, and used to detect an included-angle between the first body 101 and the second body 102; when opening/closing the electronic device, the included-angle between the first body 101 and the second body 102 will have a change; thus, with the angular displacement sensor, it can be detected whether or not the electronic device is in a motion state, i.e., when it is detected that the included-angle has a change, the step 202 is executed.

In the fourth embodiment, since opening/closing or other movement acted by the electronic device are generally operated by a user's hands, the user's hands will grip the electronic device; therefore, the detection unit specifically may be a pressure sensor(s), which is/are distributed on the first body 101 and/or the second body 102, preferably distributed on the periphery(-ies) of the first body 101 and/or the second body 102, because the user's hands will generally grip the periphery(-ies) of the first body 101 and/or the second body 102 when he intends opening/closing the electronic device; so, provided that the pressure sensor is distributed on the periphery(-ies) of the first body 101 and/or the second body 102, it can be easily detected whether or not a gripping body grips the first body 101 and/or the second body 102. The periphery(-ies) of the first body 101 and/or the second body 102, for example, are/is such a region that is between—a frame(s) of the first body 101 and/or the second body 102—and—a peframeeter at a predefined distance from the out edge of the frame(s) of the first body 101 and/or the second body 102.

Figure 3:
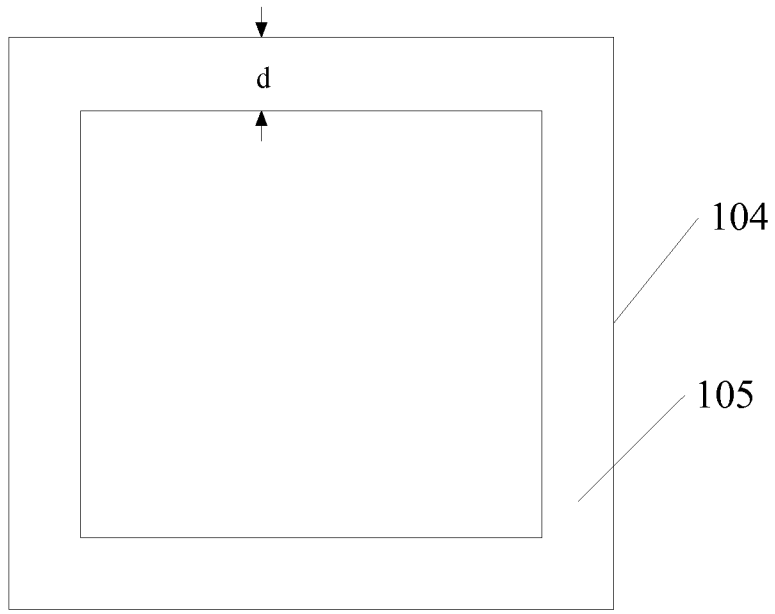
FIG. 3 is a schematic diagram showing an arrangement position of a detection unit, provided in an embodiment of the present invention.

With reference to FIG. 3, FIG. 3 shows the frame(s) 104 of the first body 101 and/or the second body 102, and a predefined distance value d, for example 4 cm; usually, when a user's hand grips the electronic device, the widest distance that it occupies on each surface of the first body 101 and/or the second body 102 is about 4 cm; although such a value may be different depending on a hand of a different user, and also has relation to a gripping gesture, the predefined distance value of 4 cm however can meet a criteria for most users. A region 105 is a periphery(-ies) of the first body 101 and/or the second body 102; the shape of the region 105 has relation to the shape of the frame 104, for example, if the frame 104 is circular, then the shape of the region 105 is annular. Of course, the above description are merely for examples, but not for limiting the present invention; the arrangement position of the pressure sensor can be set by the skilled in the art, according to actual conditions in a specific implementation, as long as a gripping body can be detected at the time that the gripping body grips the electronic device.

When it is detected a gripping body grips the first body 101 and/or the second body 102, it indicates that a user is performing or is going to perform an opening/closing action, or the user is just using one hand to grip the first body 101, since there is a touch screen 103 on the first body 101; thus, when a user's hand grips the touch screen 103, it also possibly causes a misoperation; therefore, in all these cases, the input apparatus 103 can be disabled, that is, step 202 and step 203 are to be executed. Therefore, with the detect method, a precise detection result and a wide range of detection can be provided, and thus the method can be applied in a variety of application scenarios.

Next, again with reference to FIG. 2, in step 202, a disable command is generate, which in a specific implementation, may be that, one disable command is generated for disabling N number of input apparatuses, and certainly also may be that, N number of disable sub-commands are generated for disabling N number of input apparatuses respectively, that is, one disable sub-command corresponds to one input apparatus.

The disable command is, for example, a disconnection of the power supply of an input apparatus, or no response to a signal from an disabled input apparatus; it is also possible for the skilled in the art to adopt other forms of disabling of an input apparatus and select according to actual implementation needs.

The foregoing embodiments specifically describe how to detect whether or not the first body 101 and/or the second body 102 are/is in a motion state; next, a detailed description will be given on how to determine N number of input apparatuses from the M number of input apparatuses 103.

In a specific implementation, the M number of input apparatuses 103 can be all disabled, and such method is relatively simple and also can achieve an absolute prevention of a misoperation; but in some cases, it is not necessary to disable all the input apparatuses, for example, when there is only one hand gripping on the first body 101, it is not necessary to disable the input apparatuses on the second body 102, since the user's hand does not grip the second body 102, and thus an input apparatus thereon will not be inadvertently touched, and consequently a misoperation will not be caused; therefore, at this point, it is sufficient to only disable the input apparatuses on the first body 101, for example, to disable the touch screen.

In an embodiment, before step 202, grip-position-information of a gripping body on the first body 101 and/or the second body 102 can be obtained through detection; next, based on the grip-position-information, it is judged whether or not the distance between the gripping body and the respective M number of input apparatuses 103 meets a predefined condition, so as to obtain M number of judgement results; then, based on the M number of judgement results, N number of input apparatuses from the M number of input apparatuses 103 are determined, wherein, the distance between each input apparatus of the N number of input apparatuses and the gripping body meets the predefined condition.

Specifically, as described in the foregoing examples, for example, if a gripping body only grips the first body 101, then only the input apparatuses on the first body 101 are disabled, and if a gripping body only grips the second body 102, then only the input apparatuses on the second body 102 are disabled; in this embodiment, the predefined condition is that the gripping body and the input apparatus are located on the same body.

Figure 4:
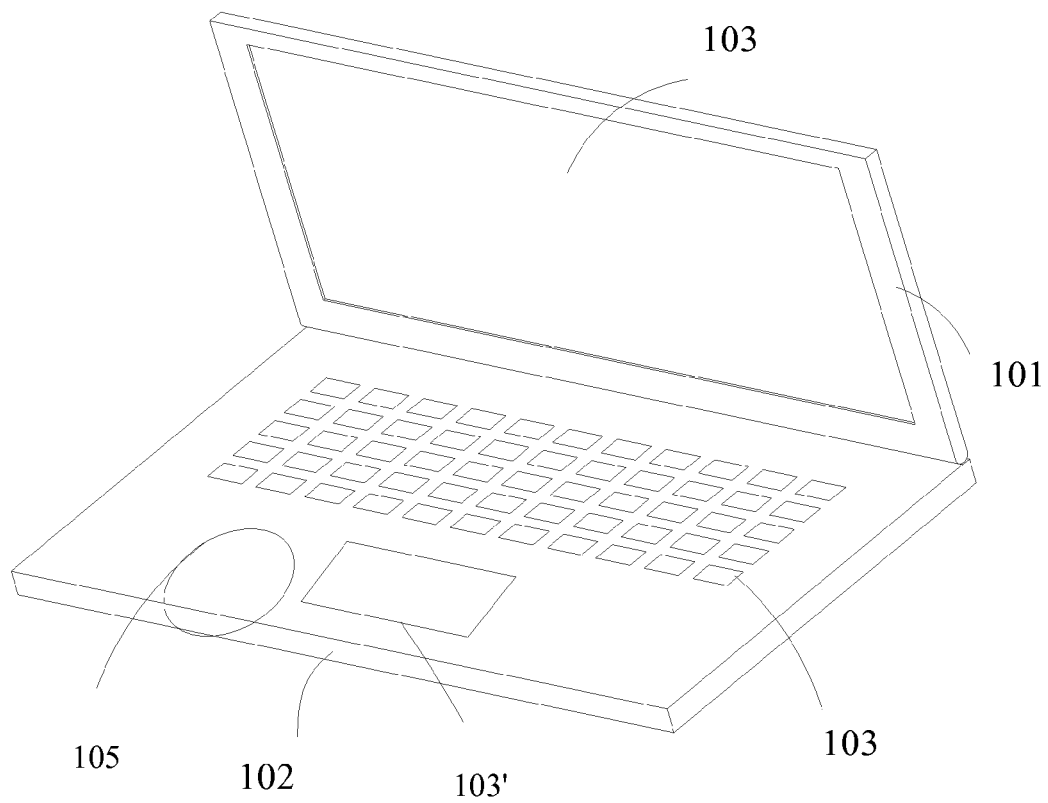
FIG. 4 is a schematic diagram showing positional relationships between a gripping body and respective input apparatuses, provided in an embodiment of the present invention.

In another embodiment, even if a gripping body only grips the first body 101, or the gripping body only grips the second body 102, there are however two ore more input apparatuses provided on the first body 101 or on the second body 102, for example, as shown in FIG. 4, there is a touch-control panel 103' and a keyboard 103 provided on the second body 102, with the touch-control panel 103' being provided near the periphery of the second body 102, and the keyboard 103 being provided near the rotary apparatus; if it is detected that a user's finger 105 grips at a peripheral position of the second body 102, that is, at a position near the touch-control panel 103', for example, it is possibly detected that the finger 105 is at a distance of 1 cm from the touch-control panel 103', meanwhile the finger 105 is at a distance of 3 cm from the keyboard 103, and the predefined condition is that a distance value should be greater than or equal to 1 cm; thus, it is judged that the finger 105 will not touch the keyboard 103 at the inner side, therefore, a disable command for only disabling the touch-control panel 103' is generated; in this way, resources and time are saved.

The above is merely for exemplary explanation; of course, in other embodiments, the predefined condition also may be any other condition, which can be set selectively by the skilled in the art, according to the number and positions of the specific input apparatuses on the first body 101 and the second body 102, which will be no more described here.

The foregoing respective embodiments are explained, by examples where an input apparatus enters to a disabled state from an non-disabled state; of course, after step 203, it is also possible to detect the state-information of the first body 101 and/or the second body 102 in real-time, to obtain a second detection result; when the second detection result indicates that the first body 101 and the second body both are not in a motion state, an enable command is generated; then, the enable command is executed, so that the N number of input apparatuses are in an enabled state, that is, the input apparatuses are restored to their normal work state.

Further, when the second detection result indicates that the first body 101 and/or the second body 102 are/is still in a motion state, the N number of input apparatuses are remained in a disabled state, until it is detected that the first body 101 and the second body 102 both are not in a motion state.

The electronic device further comprises a processing unit, which is used to execute step 202 and step 203; the processing unit may be provided on a circuit board of the electronic device; of course, in another embodiment, the processing unit specifically is used, as described in the above embodiments, to fullfil a procedure of determining N number of input apparatuses from the M number of input apparatuses 103, that is: when the detection result indicates that the first body 101 and/or the second body 102 are/is in a motion state and before a disable command is generated, to detect and obtain grip-position-information of a gripping body on the first body 101 and/or the second body 102; based on the grip-position-information, to judge whether or not the distance between the gripping body and the respective M number of input apparatuses 103 meets a predefined condition, so as to obtain M number of judgement results; based on the M number of judgement results, to determine N number of input apparatuses from the M number of input apparatuses 103, wherein, the distance between each input apparatus of the N number of input apparatuses and the gripping body meets the predefined condition.

One or more technical solutions provided in the embodiments of the present invention, has/have at least the following technical effects or advantages:

In an embodiment of the present invention, by detecting state-information of two bodies of an electronic device, it is judged whether or not the two bodies of the electronic device are in a motion state, i.e., whether or not there is an opening/closing action; when the judgement result is that at least one of the two bodies is in a motion state, a disable command is generated; then the disable command is executed, so that N number of input apparatuses from M number of input apparatuses are in a disabled state; thus, even if an input apparatus is inadvertently touched by a user in the process of opening/closing the electronic device, it will not cause a misoperation.

Furthermore, in an embodiment of the present invention, when it is detected that the electronic device is in an opening/closing state, it further detects whether there is a gripping body, such as grip-position-information of a user's hand on the two bodies; next, based on the grip-position-information, it judges whether or not the distance between the gripping body and the respective M number of input apparatuses meets a predefined condition; then, N number of input apparatuses from the M number of input apparatuses are determined, i.e., it is sufficient to disable only the input apparatuses close to the user's hand, and unnecessary to disable all the input apparatuses; thus, time and resources can be saved.

Obviously, various alterations and modifications can be made to the present invention by the skilled in art, without departing from the spirit and scope of the present invention. Accordingly, insofar as these alterations and modifications fall in the scope of the appended claims and their equivalents of the invention, these alterations and modifications are also intended to be included within the present invention.

The invention claimed is:

1. A method of controlling an electronic device that comprises a first body, a second body and a rotary apparatus; on at least one body of the first body and the second body, there are provided M number of input apparatuses; the first body and the second body are rotatably connected together through the rotary apparatus, where M is an integer greater than or equal to 1; wherein the method comprises:
   detecting a state-information of the first body and/or the second body to obtain a detection result;
   when the detection result indicates that the first body and/or the second body are/is in a motion state:
      detecting and obtaining a grip-position-information of a gripping body on the first body and/or the second body;
      based on the grip-position-information, it is judged whether or not the distance between the gripping body and the respective M number of input apparatuses meets a predefined condition, to obtain M number of judgment results;

based on the M number of judgment results, N number of input apparatuses from the M number of input apparatuses are determined, wherein, the distance between each input apparatus of the N number of input apparatuses and the gripping body meets the predefined condition;

generating a disable command so that N number of input apparatuses from the M number of input apparatuses are in a disabled state, where N is an integer less than or equal to M and the N number of apparatuses are determined based on the grip-position-information.

2. The method according to claim 1, wherein said step of detecting the state-information of the first body and/or the second body comprises:

a first absolute included-angle between the first body and a first reference plane is detected, and/or, a second absolute included-angle between the second body and a second reference plane is detected, wherein, the first reference plane and the second reference plane are the same or different reference planes; or a first acceleration of the first body is detected, and/or, a second acceleration of the second body is detected; or an included-angle between the first body and the second body is detected; or it is detected whether or not a gripping body grips the first body and/or the second body.

3. The method according to claim 2, wherein said step of generating a disable command when the detection result indicates that the first body and/or the second body are/is in the motion state comprises:

generating the disable command when the first absolute included-angle and/or the second absolute included-angle have/has a change; or generating the disable command when the first acceleration and/or the second acceleration are/is not zero; or generating the disable command when the included-angle has a change; or generating the disable command when a gripping body grips the first body and/or the second body.

4. The method according to claim 1, wherein said step of generating a disable command comprises:

generating a disable command for disabling the N number of input apparatuses; or generating N number of disable sub-commands for disabling the N number of input apparatuses respectively.

5. The method according to claim 1, wherein after the disable command is executed, the method further comprises:

detecting the state-information of the first body and/or the second body to obtain a second detection result;

generating an enable command when the second detection result indicates that the first body and the second body both are not in the motion state;

executing the enable command so that the N number of input apparatuses are in an enabled state.

6. The method according to claim 5, wherein after the second detection result is obtained, the method further comprises:

when the second detection result indicates that the first body and/or the second body are/is in the motion state, the N number of input apparatuses are remained in the disabled state.

7. An electronic device, wherein the electronic device comprises:

a first body;

a second body;

a rotary apparatus, through which the first body and the second body are rotatably connected together;

M number of input apparatuses, provided on at least one body of the first body and the second body, where M is an integer greater than or equal to 1;

a detection unit, which is used to detect the state-information of the first body and/or the second body, so as to obtain a detection result;

a processing unit, which is used when the detection result indicates that the first body and/or the second body are/is in a motion state:

to detect and obtain a grip-position-information of a gripping body on the first body and/or the second body;

based on the grip-position-information, to judge whether or not the distance between the gripping body and the respective M number of input apparatuses meets a predefined condition, so as to obtain M number of judgment results;

based on the M number of judgment results, to determine N number of input apparatuses from the M number of input apparatuses, wherein, the distance between each input apparatus of the N number of input apparatuses and the gripping body meets the predefined condition;

to generate a disable command; and, to execute the disable command, so that N number of input apparatuses of the M number of input apparatuses are in a disabled state, where N is an integer less than or equal to M wherein the N number of apparatuses are determined based on the grip-position-information.

8. The electronic device according to claim 7, wherein the detection unit is a pressure sensor, which is provided on the first body and/or the second body, and which is used: to detect whether or not a gripping body grips the first body and/or the second body; and when the gripping body grips the first body and/or the second body, to obtain the detection result.

* * * * *